United States Patent
Ishigo

(10) Patent No.: US 8,034,515 B2
(45) Date of Patent: Oct. 11, 2011

(54) PATTERN FORMING METHOD, PATTERN DESIGNING METHOD, AND MASK SET

(75) Inventor: Kazutaka Ishigo, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 12/556,967

(22) Filed: Sep. 10, 2009

(65) Prior Publication Data

US 2010/0291477 A1 Nov. 18, 2010

(30) Foreign Application Priority Data

May 18, 2009 (JP) ................. 2009-120274

(51) Int. Cl.
*G03C 5/00* (2006.01)
*G03F 1/00* (2006.01)
*G03F 9/00* (2006.01)

(52) U.S. Cl. ............... 430/5; 430/22; 430/394

(58) Field of Classification Search ............... 430/5, 22, 430/394; 356/399, 401; 355/53
See application file for complete search history.

(56) References Cited

U.S. PATENT DOCUMENTS

| 6,841,321 B2* | 1/2005 | Matsumoto et al. ............ 430/30 |
| 2004/0119956 A1* | 6/2004 | Fukagawa ..................... 355/52 |
| 2006/0117293 A1 | 6/2006 | Smith et al. |
| 2006/0139642 A1* | 6/2006 | Van Bilsen .................... 356/400 |
| 2008/0013176 A1 | 1/2008 | Wang et al. |
| 2008/0144036 A1 | 6/2008 | Schaar et al. |

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

A pattern designing method according to an embodiment of the present invention includes: designing a first pattern for inspection formed by arraying a plurality of first mark rows, in which rectangular marks are arrayed at predetermined intervals in a first direction, in a second direction perpendicular to the first direction and designing a second pattern for inspection formed by arraying, in the second direction, a plurality of second mark rows in which rectangular marks are arranged among the marks arrayed in the first direction of the first mark row and a forming position in the second direction is arranged to overlap the first mark row by predetermined overlapping length.

20 Claims, 14 Drawing Sheets 221, 223

221, 223

221, 223

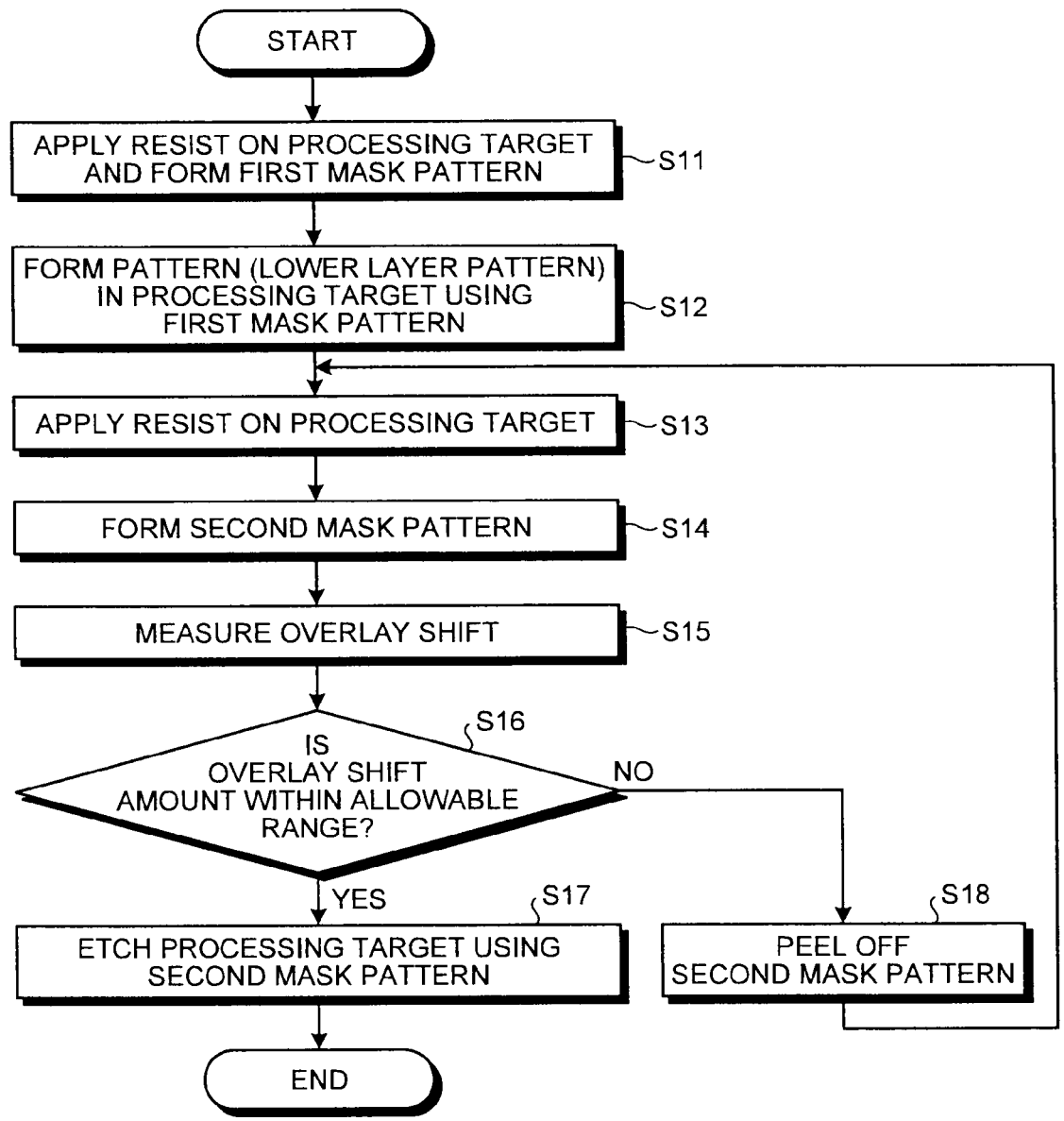

US 8,034,515 B2

PATTERN FORMING METHOD, PATTERN DESIGNING METHOD, AND MASK SET

CROSS-REFERENCE TO RELATED APPLICATIONS

This application is based upon and claims the benefit of priority from the prior Japanese Patent Application No. 2009-120274, filed on May 18, 2009; the entire contents of which are incorporated herein by reference.

BACKGROUND OF THE INVENTION

1. Field of the Invention

The present invention relates to a pattern forming method, a pattern designing method, and a mask set.

2. Description of the Related Art

In a method of manufacturing a semiconductor device in the past, to form a plurality of device patterns on a semiconductor wafer of silicon or the like, a large number of different mask patterns are sequentially laid one on top of another on the semiconductor wafer and exposed to light. In the exposure, an exposure device positions respective masks using an alignment mark. In a state in which the masks are positioned, the exposure device performs overlay shift inspection for inspecting whether a device pattern that should be formed next is formed to be correctly stacked on a device pattern on each chip already provided on the semiconductor wafer.

There is a scatterometry system as a system for the overlay shift inspection. In the scatterometry system, light is irradiated on marks including diffraction gratings respectively arranged and formed in a first layer in which a first device pattern is formed and a second layer formed on the first layer and including photoresist exposed and developed into a second device pattern. Subsequently, diffracted light in marks of the repeated patterns is detected, whereby a sectional profile corresponding to the marks of the repeated patterns is calculated and an amount of overlay shift is determined. A first mark formed in the first layer and a second mark formed in the second layer are formed to partially overlap (see, for example, US2008/0144036A1).

As the marks for the overlay shift inspection, first, in the first layer, the first mark including recesses having a predetermined period is formed on, for example, a dicing line between chips together with the first device pattern by using the photolithography technique and the etching technique. Thereafter, photoresist is applied on the first layer to form the second layer. The second mark including recesses having a predetermined period is formed, together with the second device pattern, on a dicing line to partially overlap the first mark. When the second mark is formed, a step is formed on an upper surface of the photoresist according to the first mark. Therefore, the second mark is affected by defocus during exposure in a lithography process. As a result, it is likely that facon of the marks is spoiled to cause deterioration in measuring accuracy.

BRIEF SUMMARY OF THE INVENTION

A pattern forming method for forming a pattern in a processing target using a mask pattern formed in resist applied on the processing target according to an embodiment of the present invention, the pattern forming method comprises:

A pattern forming method for forming a pattern in a processing target using a mask pattern formed in resist applied on the processing target according to an embodiment of the present invention, the pattern forming method comprises: applying the resist on the processing target in which a first device pattern cut in a predetermined shape and a first pattern for overlay shift inspection formed by arraying a plurality of first mark rows, in which marks cut in a rectangular shape are arrayed at predetermined intervals in a first direction, in a second direction perpendicular to the first direction are formed; forming, in the resist, a mask pattern for forming a second device pattern and a second pattern for overlay shift inspection formed by arraying, in the second direction, a plurality of second mark rows in which marks cut in a rectangular shape are arranged among the marks arrayed in the first direction of the first mark row and a forming position in the second direction is arranged to overlap the first mark row by predetermined overlapping length; calculating an overlay shift amount of the second pattern for overlay shift inspection with respect to the first pattern for overlay shift inspection by detecting diffracted light obtained by irradiating light on the first and second patterns for overlay shift inspection; determining whether the calculated overlay shift amount is within a predetermined range; and when the overlay shift amount is not within the predetermined range, repeatedly performing processing for peeling off the resist and applying the resist on the processing target to processing for determining whether the overlay shift amount is within the predetermined range and, when the overlay shift amount is within the predetermined range, processing the processing target using the mask pattern formed in the resist.

A pattern designing method for designing a pattern including a device pattern formed on a processing target and a pattern for overlay shift detection having a diffractive grating shape for detecting overlay shift with respect to a pattern already formed on the processing target according to an embodiment of the present invention, the pattern designing method comprises: designing a first pattern including a first device pattern formed on the processing target and a first pattern for overlay shift inspection formed by arraying a plurality of first mark rows, in which rectangular marks are arrayed at predetermined intervals in a first direction, in a second direction perpendicular to the first direction; and designing a second pattern including a second device pattern formed on the processing target and a second pattern for overlay shift inspection formed by arraying, in the second direction, a plurality of second mark rows in which, on the processing target, rectangular marks are arranged among the rectangular marks arrayed in the first direction of the first mark row and a forming position in the second direction is arranged to overlap the first mark row by predetermined overlapping length.

A mask set including, according to a processing process for a processing target, a plurality of masks for exposure each including a device pattern formed on the processing target and a pattern for overlay shift detection having a diffractive grating shape for detecting overlay shift with respect to a pattern formed on the processing target by a different processing process according to an embodiment of the present invention, the mask set comprises: a first mask for forming, on the processing target, a pattern including a first device pattern and a first pattern for overlay shift inspection formed by arraying, in a second direction, a plurality of first mark rows in which rectangular marks are arrayed at predetermined intervals in a first direction perpendicular to the second direction; and a second mask for forming, on the processing target, a pattern including a second device pattern and a second pattern for overlay shift inspection formed by arraying, in the second direction, a plurality of second mark rows in which, on the processing target, rectangular marks are arranged among the rectangular marks arrayed in the first direction of the first mark row and a forming position in the second direction is arranged to overlap the first mark row by predetermined overlapping length.

BRIEF DESCRIPTION OF THE DRAWINGS

FIG. 6 is a flowchart of an example of a pattern forming method according to the embodiment;

DETAILED DESCRIPTION OF THE INVENTION

Exemplary embodiments of the present invention are explained in detail below with reference to the accompanying drawings. The present invention is not limited by the embodiments. Sectional views of a semiconductor device referred to in an embodiment explained below are schematic. A relation between the thickness and the width of a layer, a ratio of the thicknesses of layers, and the like are different from actual ones.

Figure 1:
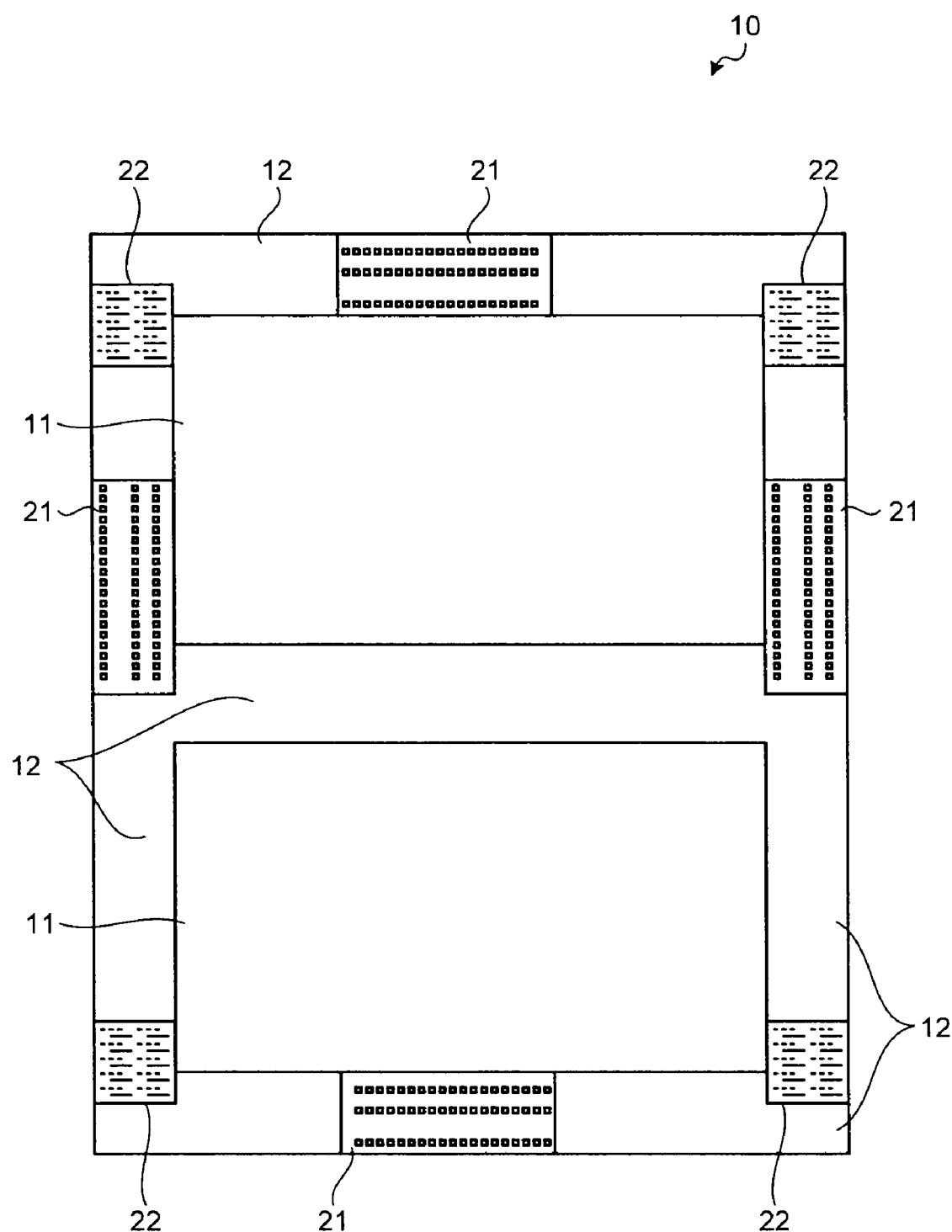
FIG. 1 is a top view of an example of patterns formed on a wafer.

FIG. 1 is a top view of an example of patterns formed on a wafer. In the figure, it shows schematically state that patterns are formed on resist after the resist is applied on a processing target 10 processed into a predetermined pattern such as a wafer or a processed film formed on the wafer and patterns are formed.

On the processing target 10, chip forming areas 11 in which a device pattern is formed in each chip and dicing lines 12 for cutting manufactured chips are formed. As device patterns (not shown in the figure) formed in the chip forming areas 11, different patterns are formed in respective processes. On the dicing lines 12 in respective layers, alignment marks 21 and patterns for overlay shift inspection (hereinafter also simply referred to as "patterns for inspection") 22 are formed. The alignment marks 21 are marks for performing alignment between a mask (a reticle) and a wafer during exposure. The patterns for overlay shift inspection 22 are patterns for inspecting overlay shift between a forming position of a resist pattern in an upper layer and a forming position of a device pattern in a lower layer. The patterns for inspection 22 used in this example are marks for detecting overlay shift using diffracted light. Basically, the patterns for inspection 22 include diffraction gratings having a predetermined period. The patterns for inspection 22 include recesses cut in the processing target 10 or the like. In the patterns for inspection 22 formed on the dicing lines 12 shown in FIG. 1, patterns for inspection in a lower layer are indicated by dotted lines and patterns for inspection formed in resist in an upper layer are indicated by solid lines.

Figure 2A:
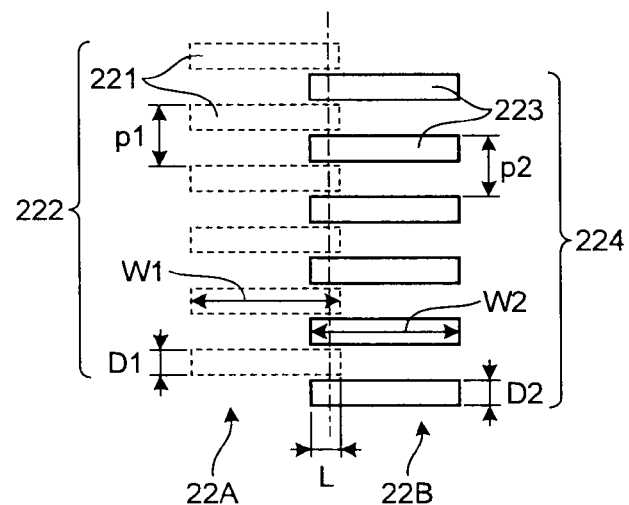
FIG. 2A is a partial plan view of an example of patterns for overlay shift inspection according to an embodiment of the present invention.
Figure 2B:
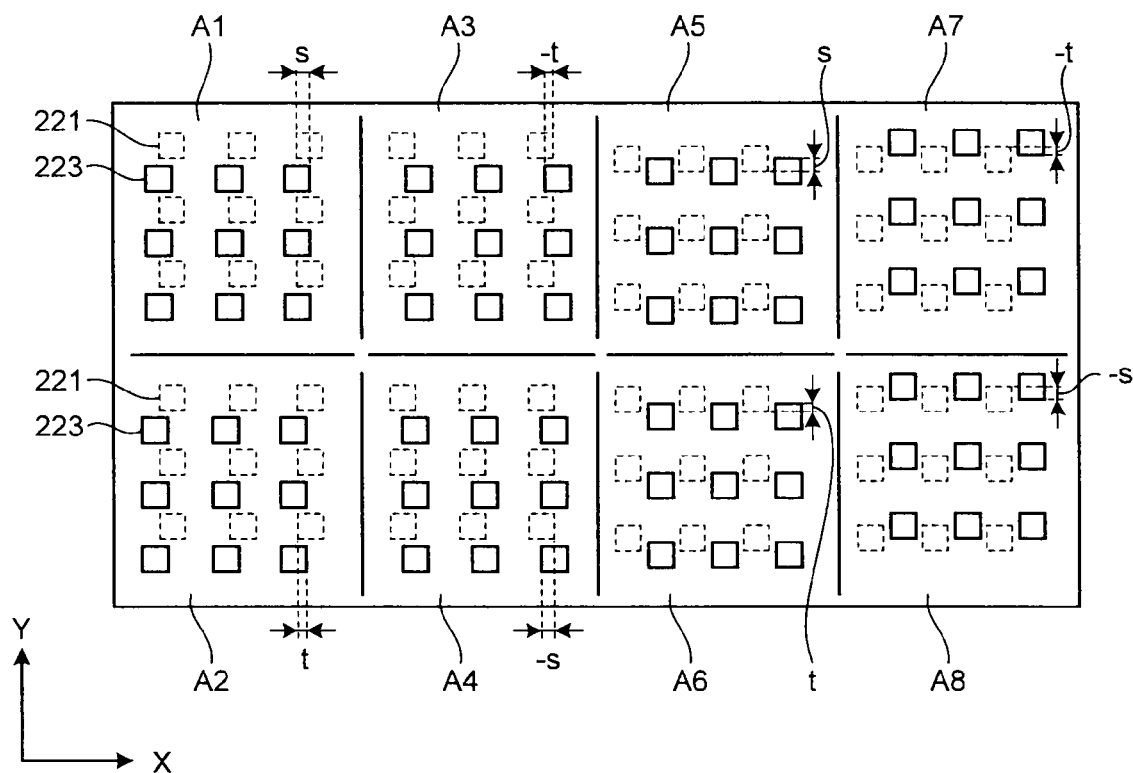
FIG. 2B is a diagram of an example of the arrangement of the patterns for overlay shift inspection.

FIG. 2A is a plan view of an example of patterns for overlay shift inspection according to an embodiment of the present invention. FIG. 2B is a diagram of an example of the arrangement of the patterns for inspection.

As shown in FIG. 2A, a pattern for inspection 22A in a lower layer includes a mark row 222 in which a plurality of rectangular marks 221 having length D1 in a first direction and having width W1 in a second direction perpendicular to the first direction are arrayed at pitch p1 in the first direction. Although not shown in the figure, a plurality of the mark rows 222 are arrayed in the second direction. A pattern for inspection 22B in the upper layer includes a mark row 224 in which a plurality of rectangular marks 223 having length D2 in the first direction and having width W2 in the second direction are arrayed at pitch p2 in the first direction. Although not shown in the figure, a plurality of the mark rows 224 are arrayed in the second direction.

The marks 223 included in the pattern for inspection 22B in the upper layer are designed not to overlap, in a plan view, the marks 221 included in the pattern for inspection 22A in the lower layer, i.e., to be arranged in zigzag. Forming positions of the marks 221 in the lower layer and the marks 223 in the upper layer in a width direction of the marks (the second direction) are arranged such that the marks 221 and the marks 223 overlap by length L.

The lengths D1 and D2 of the patterns for inspection 22 are desirably set small to obtain dense information of the marks 221 and 223 in measurement according to the diffracted light principle. Specifically, the lengths D1 and D2 are desirably equal to or smaller than mark dimensions W1 and W2. However, because the marks 221 and 223 are formed by lithography, the lengths D1 and D2 are designed to be equal to or larger than a dimension that can be resolved by the lithography.

Similarly, the pitches p1 and p2 of the marks 221 and 223 are desirably set small to obtain dense information of the marks 221 and 223 in the measurement according to the diffracted light principle. Specifically, the pitches p1 and p2 are desirably twice to three times as large as the lengths D1 and D2 (mark length:space width=1:1 to 1:2). However, the pitches p1 and p2 of the marks 221 and 223 are also designed to be equal to or larger than the dimension that can be resolved by the lithography.

When the patterns for overlay shift inspection 22A and 22B including the marks 221 and 223 are arranged on the dicing lines, for example, as shown in FIG. 2B, a plurality of patterns for overlay shift inspection 22A and 22B with varied overlay amounts L, arranging directions of the marks (the direction of the mark rows 222 and 224), and the like are collectively arranged. In FIG. 2B, a left to right direction on the paper surface is represented as X direction and a direction perpendicular to the X direction in the paper surface is represented as Y direction.

In this example, the patterns for inspection are respectively arranged in eight areas A1 and A8. In the areas A1 to A4, the marks 221 and 223 are arranged such that the first direction (the direction of the lengths D1 and D2 of the marks) shown in FIG. 2A is set in the Y direction. In the areas A5 to A8, the marks 221 and 223 are arranged such that the first direction shown in FIG. 2A is set in the X direction.

In the area A1, the marks 221 of the pattern for inspection in the lower layer and the marks 223 of the pattern for inspection in the upper layer are arranged such that the overlay amount L thereof in the X direction (the width direction) is s (s>0). In the area A2, the marks 221 in the lower layer and the marks 223 in the upper layer are arranged such that the overlay amount L thereof in the X direction is t (s>t>0). In the areas A3 and A4, the marks 221 in the lower layer and the marks 223 in the upper layer are arranged such that the overlay amount L thereof in the X direction is −t and −s, respectively. Similarly, in the areas A5, A6, A7, and A8, the marks 221 in the lower layer and the marks 223 in the upper layer are arranged such that the overlay amount L thereof in the Y direction is s, t, −t, and −s, respectively.

The patterns formed on the processing target 10 as explained above are designed by computer-aided design (CAD) or the like.

The patterns for inspections 22A in the lower layer and the patterns for inspection 22B in the upper layer formed on the processing target 10 are explained above with reference to FIGS. 2A and 2B. However, the same relation is present between a first mask for forming the patterns for inspection 22A in the lower layer on the processing target 10 and a second mask for forming the patterns for inspection 22B in the upper layer on the processing target 10. Specifically, the first mask includes a first device pattern and a first pattern for inspection formed on the processing target 10 (a first resist layer). The second mask includes a second device pattern and a second pattern for inspection formed on the processing target 10 (a second resist layer). A relation between the first and second patterns for inspection formed on the first and second masks is the same as the relation explained with reference to FIGS. 2A and 2B. The patterns shown in FIGS. 2A and 2B are formed by performing exposure and development using a mask set including the first and second masks to transfer the patterns onto the resist layers on the processing target 10 or further processing the processing target 10 using the resist layers on which the patterns are transferred.

Figure 3A:
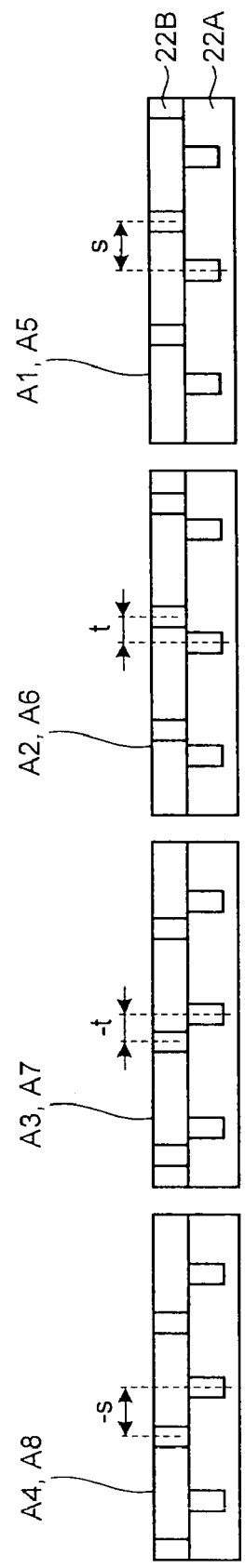
FIG. 3A is a schematic sectional view of an example of the patterns for overlay shift inspection in a state in which overlay shift does not occur.
Figure 3B:
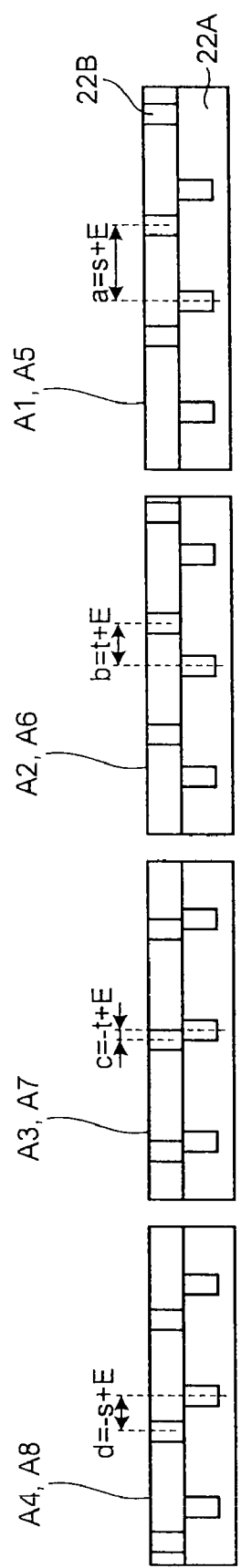
FIG. 3B is a schematic sectional view of an example of the patterns for overlay shift inspection in a state in which overlay shift occurs.

Superimposition shift of the pattern formed in the upper layer (resist) with respect to the lower layer can be detected by irradiating light on the patterns for overlay shift inspection 22 formed on the processing target 10 such as a wafer or a processed film and measuring diffracted light of the light. FIG. 3A is a schematic sectional view of an example of the patterns for overlay shift inspection in a state in which overlay shift does not occur. FIG. 3B is a schematic sectional view of an example of the patterns for overlay shift inspection in a state in which overlay shift occurs. FIGS. 3A and 3B are diagrams for schematically showing overlay shift. A degree of overlay between the pattern in the lower layer and the pattern in the upper layer is not accurately represented. In the figures, areas A1 and A5, areas A2 and A6, areas A3 and A7, and areas A4 and A8 are shown in order from the right.

In FIG. 3A, overlay shift of the positions of the patterns for inspection 22B formed in the resist in the upper layer does not occur with respect to the patterns for inspection 22A in the lower layer. The patterns for inspection 22B in the upper layer are desirably formed in positions set in advance with respect to the patterns for inspection 22A in the lower layer. However, actually, as shown in FIG. 3B, overlay shift often occurs. When overlay shift occurs, the patterns for inspection 22B in the upper layer in the respective areas shift in the same direction by an overlay shift amount E with respect to the patterns for inspection 22A in the lower layer.

An overlay amount (an offset amount) set in advance of the patterns for inspection 22B in the upper layer with respect to the patterns for inspection 22A in the lower layer is represented as L. The overlay amount E is calculated by Formula (1). Superimposition amounts including the overlay shift amount E between the patterns for inspection 22A in the lower layer and the patterns for inspection 22B in the upper layer in areas A1 (A5), A2 (A6), A3 (A7), and A4 (A8) are a (=s+E), b (=t+E), c (=−t+E), and d (=−s+E), respectively.

$$E = L\frac{a+d}{a-d} = L\frac{b+c}{b-c} \quad (1)$$

As indicated by Formula (1), the overlay shift amount E is calculated by using two patterns for inspection having the same absolute value of an overlay amount in the X direction or the Y direction, for example, patterns for inspection in the areas A1 (A5) and A4 (A8) or the areas A2 (A6) and A3 (A7). In the patterns arranged as shown in FIG. 2B, the overlay shift amount E in one direction is calculated at two points. Therefore, the accuracy of the calculation of the overlay shift amount can be improved. The overlay shift amount E in the X direction and the Y direction orthogonal to each other can be calculated.

Figure 4A:
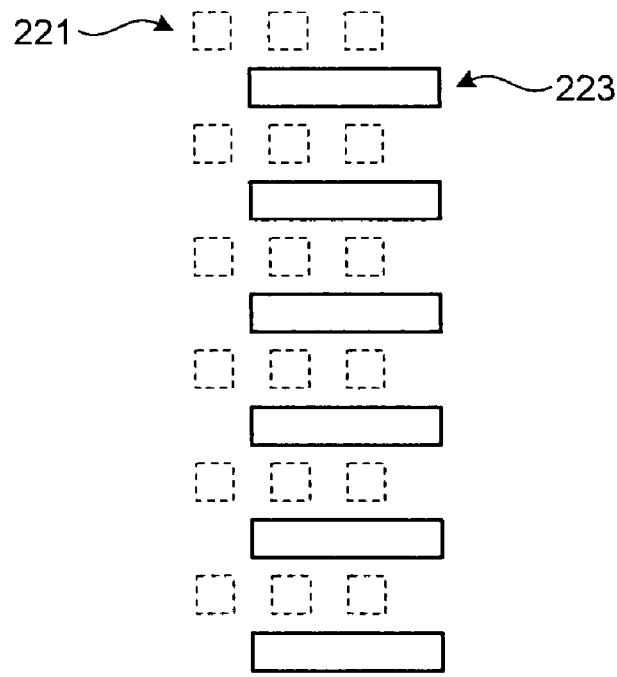
FIGS. 4A to 5C are diagrams of other examples of the pattern for overlay shift inspection.
Figure 4B:
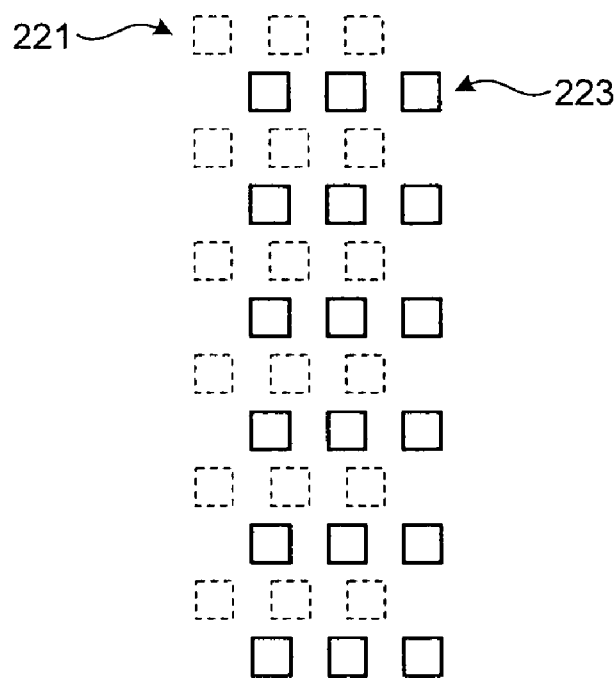

In the above explanation, the rectangular marks extending in the second direction is explained as the example of the marks included in the patterns for inspection. However, other marks can be adopted as long as the marks satisfy the conditions explained above. FIGS. 4A to 5C are diagrams of other examples of the patterns for overlay shift inspection. In FIG. 4A, the pattern for inspection in the upper layer includes the rectangular marks 223 extending in the second direction. The pattern for inspection in the lower layer includes the marks 221 having a shape obtained by dividing the rectangular marks 223 into a plurality of marks in the second direction (the marks 221, each including three marks having a substantial square shape arrayed in the second direction). In FIG. 4B, one mark 221 or 223 of the patterns for inspection in the lower layer and the upper layer is formed by the three marks having the substantial square shape arrayed in the second direction. Such marks 221 and 223 are also designed to be equal to or larger than a dimension that can be resolved by the lithography.

Figure 5A:
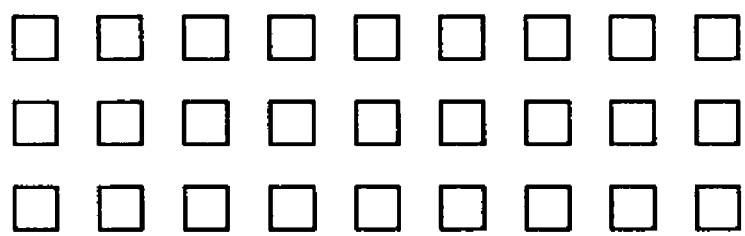
Figure 5B:
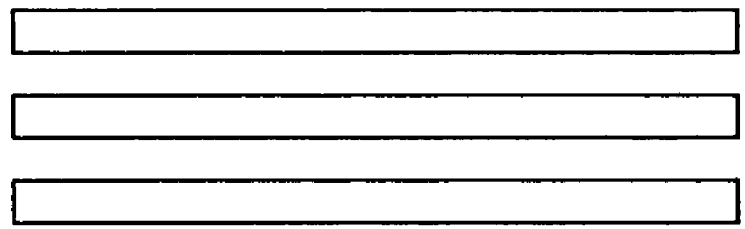
Figure 5C:
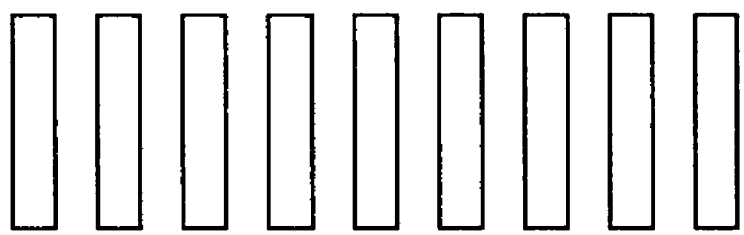

In FIG. 5A, one mark 221 or 223 included in the pattern for inspection is formed by arranging a plurality of contact-hole-like marks having a substantial square shape at predetermined intervals in the first and second directions. In FIG. 5B, one mark 221 or 223 included in the pattern for inspection is formed by arranging a plurality of rectangular marks extending in the second direction (the width direction of the mark) at predetermined intervals in the first direction. In FIG. 5C, one mark 221 or 223 included in the pattern for inspection is formed by arranging a plurality of rectangular marks extending in the first direction (the length direction of the mark) at predetermined intervals in the second direction. The marks 221 and 223 are designed to be equal to or larger than a dimension that can be resolved by the lithography. The above is only an example. The present invention is not limited to this.

FIG. 6 is a flowchart of an example of a pattern forming method according to this embodiment. FIGS. 7A, 8A, 9A, and 10A are plan views of an example of the pattern forming method according to this embodiment. FIGS. 7B, 8B, 9B, and 10B are sectional views of the example of the pattern forming method according to this embodiment. In FIGS. 7B, 8B, 9B, and 10B, sections taken along A-A shown in the plan views of FIGS. 7A, 8A, 9A, and 10A are shown, respectively.

Figure 7A:
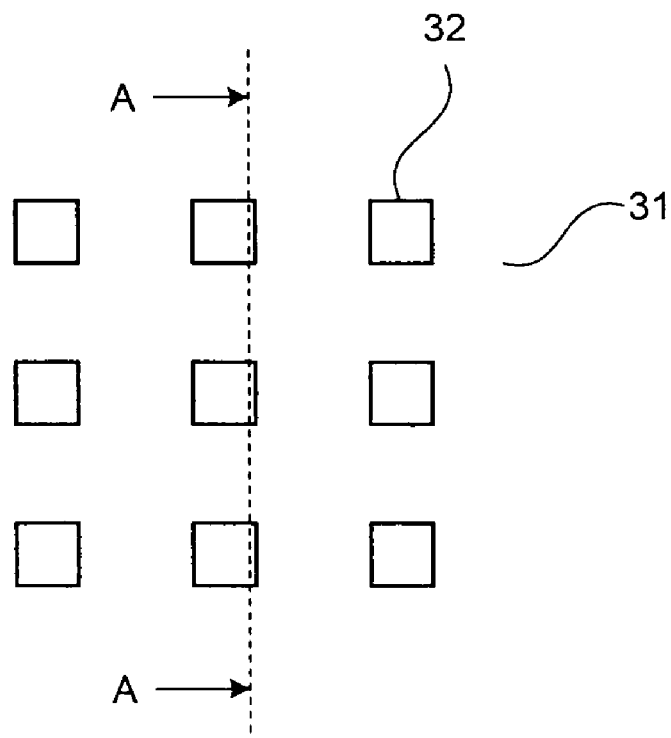
FIGS. 7A, 8A, 9A, and 10A are plan views of an example of the pattern forming method according to the embodiment.
Figure 7B:
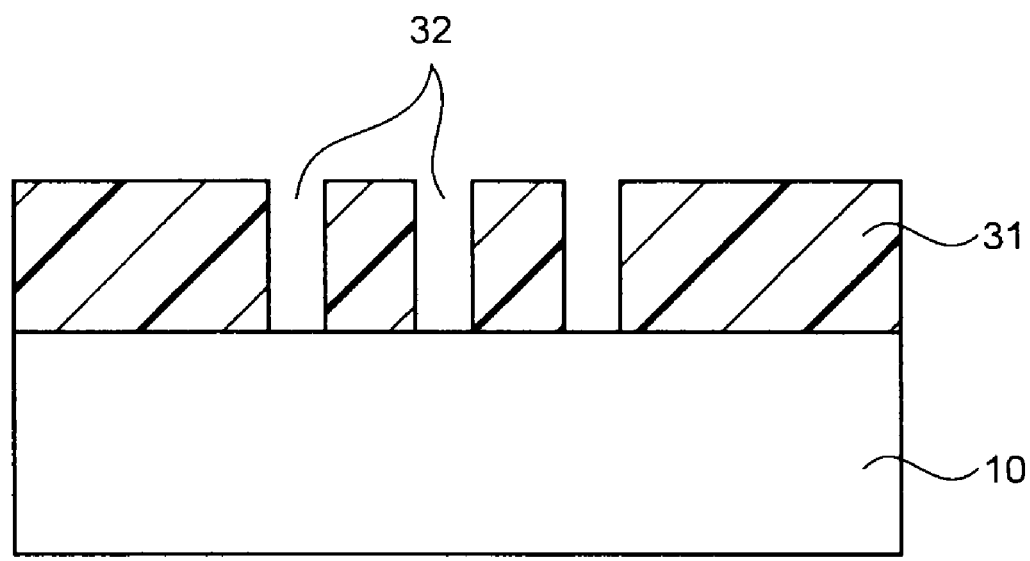
FIGS. 7B, 8B, 9B, and 10B are sectional views of the example of the pattern forming method according to the embodiment.
Figure 8A:
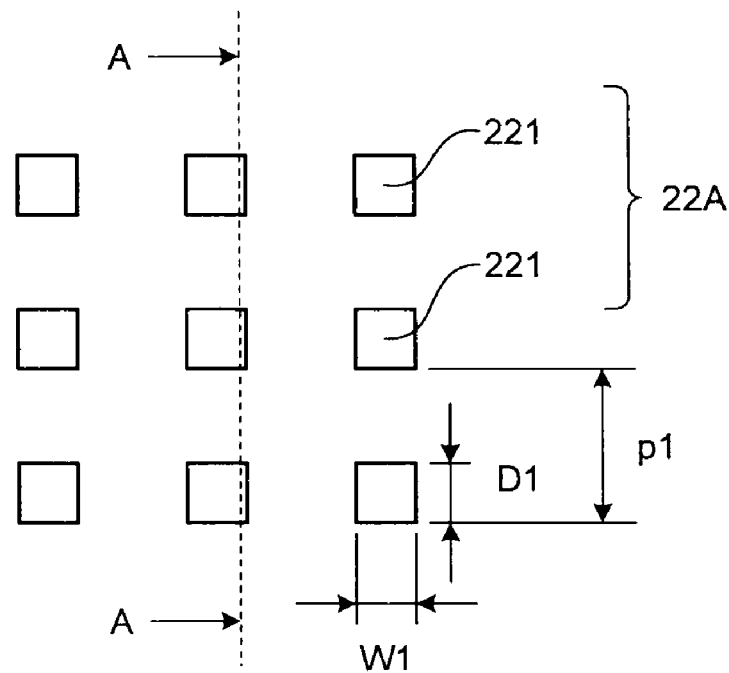
Figure 8B:
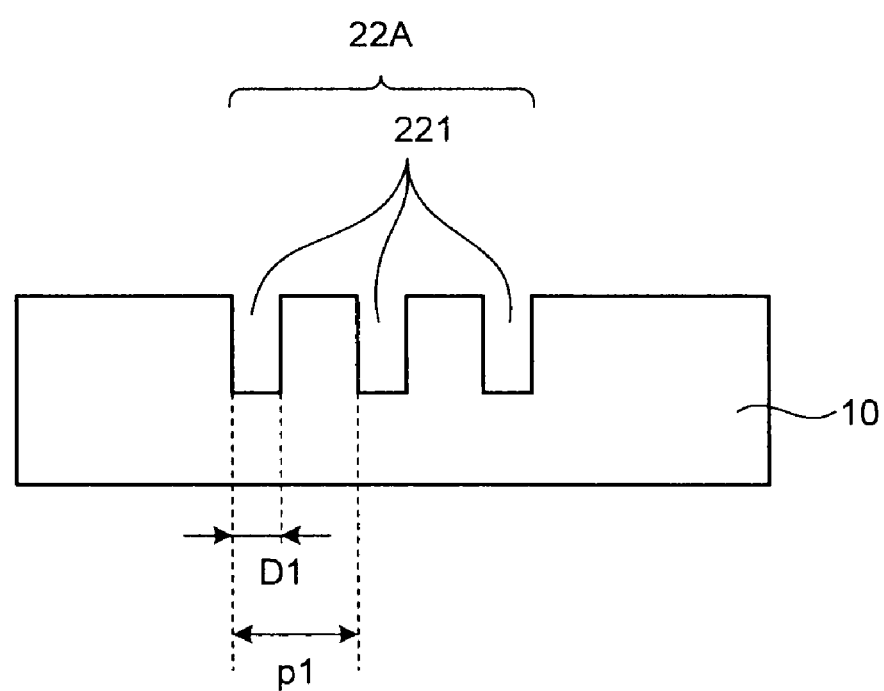

First, resist is applied on the processing target 10 such as a wafer or a film formed on the wafer and a first mask pattern 31 is formed by the lithography (step S11, FIGS. 7A and 7B). For example, photoresist is applied on the processing target 10 and exposure and development are performed by photolithography to obtain a pattern having a predetermined shape. Consequently, a mask pattern for device formation (e.g., a mask pattern for forming via holes connected to a lower wire with a dual damascene method) is formed on a not-shown chip forming area of the processing target 10. A mask pattern for forming patterns for inspection including first patterns for inspection is formed on dicing lines around the chip forming area. Openings 32 are provided in sections where the first patterns for inspection of the first mask pattern 31 are formed.

Subsequently, the processing target 10 is etched by using the formed first mask pattern 31. Recesses are formed in the processing target 10 to correspond to the openings 32 of the first mask pattern 31. After the etching, the first mask pattern 31 is removed by a method such as ashing. Consequently, a pattern in a first layer (a lower layer) having a device pattern on the chip forming area and having the first patterns for inspection 22A on the dicing lines is formed (step S12, FIGS. 8A and 8B). In the first patterns for inspection 22A, the marks 221 as recesses having length D1 and width W1 are formed at the pitch p1 in the length direction.

Figure 9A:
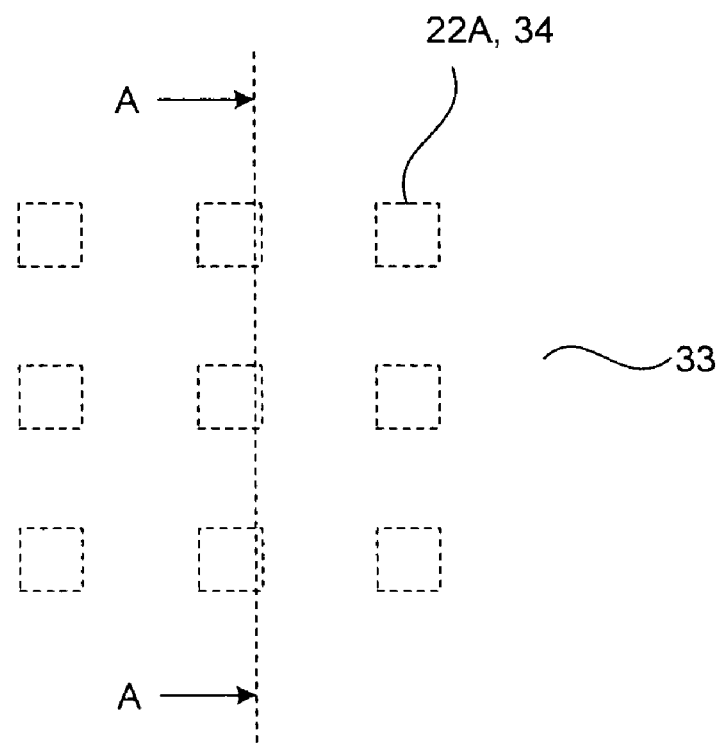
Figure 9B:
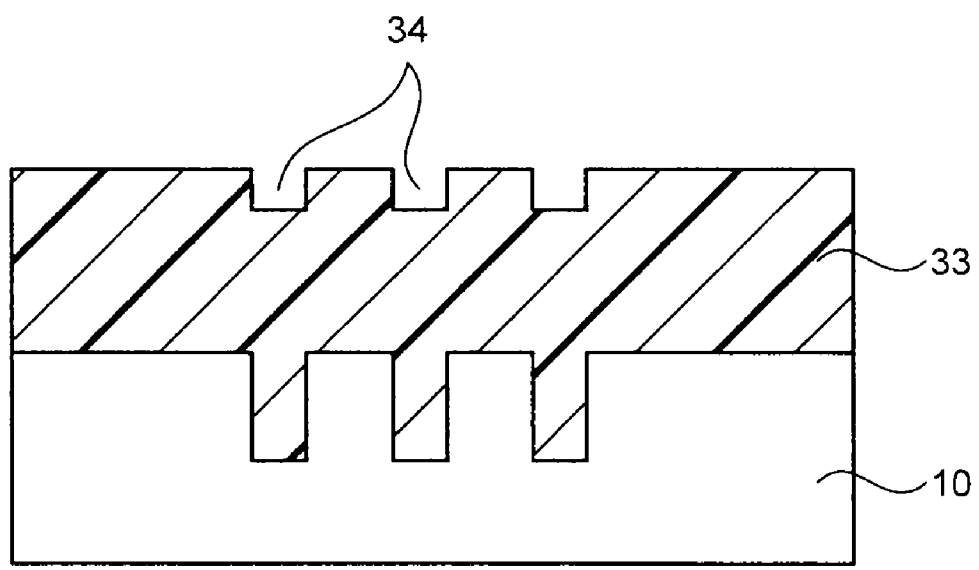

Thereafter, resist 33 is applied on the patterns in the first layer (the lower layer) (step S13, FIGS. 9A and 9B). The upper surface of the resist 33 has unevenness corresponding to the patterns of the recesses (the first patterns for inspection 22A) formed in the processing target 10. Specifically, positions corresponding to forming positions of first patterns for inspection 22A are recesses 34 lower than other sections.

Figure 10A:
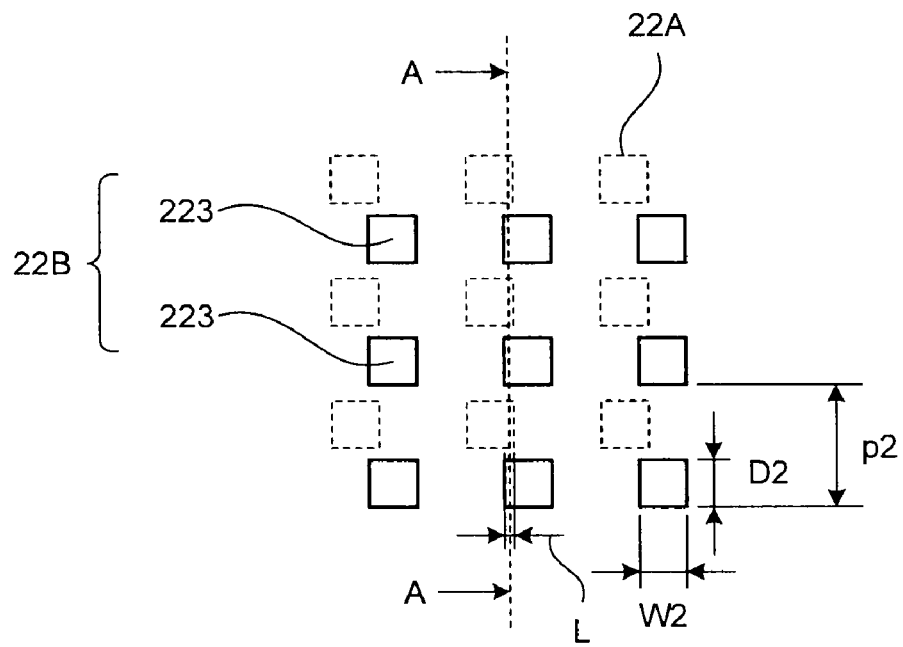
Figure 10B:
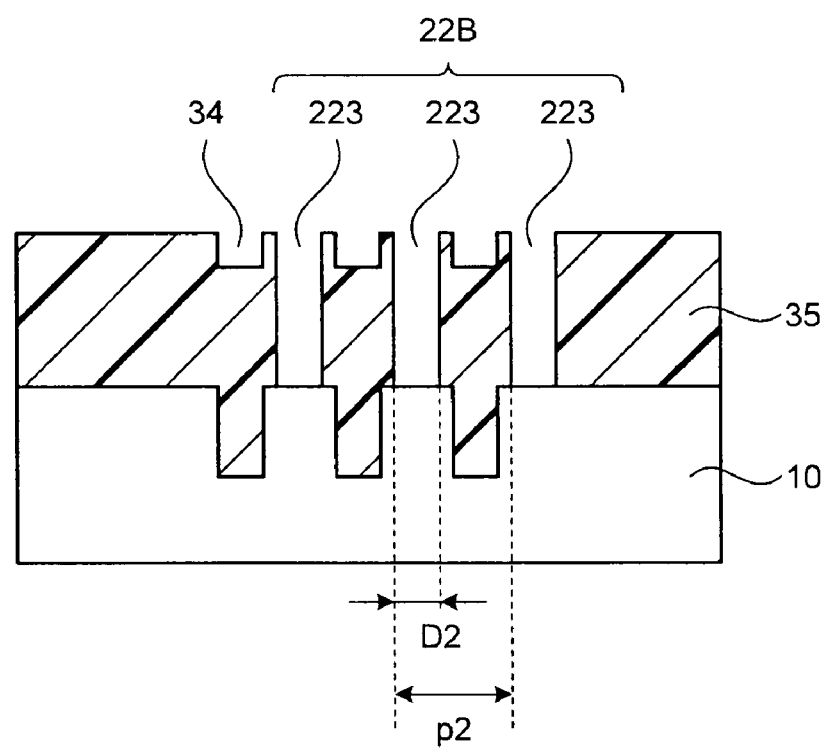
Figure 11A:
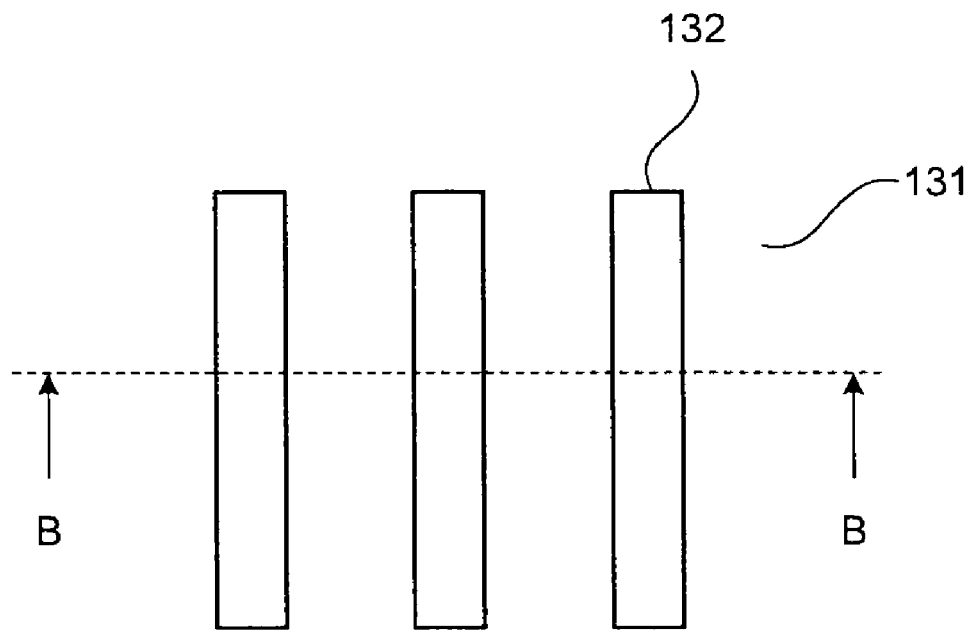
FIGS. 11A, 12A, 13A, and 14A are plan views of an example of a pattern forming method according to a related art.
Figure 11B:
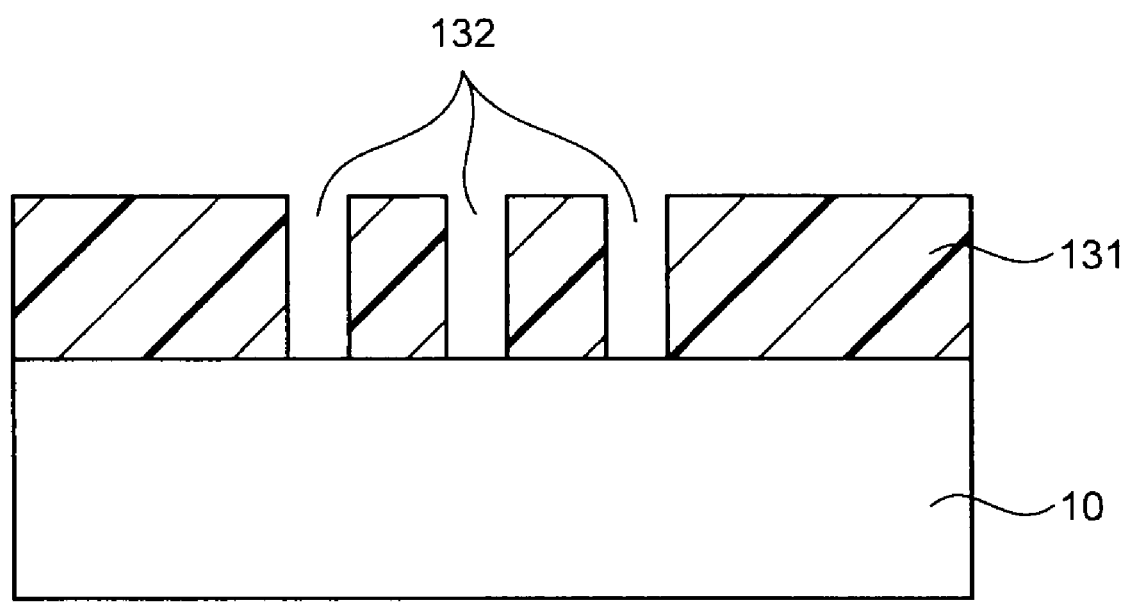
FIGS. 11B, 12B, 13B, and 14B are sectional views of the example of the pattern forming method according to the related art.

Thereafter, the resist 33 is exposed and developed by the lithography to form a second mask pattern 35 (step S14, FIGS. 10a and 10B). Consequently, a mask pattern for device formation (e.g., a mask pattern for forming an upper wire connected to via holes with the dual damascene method) is formed in the not-shown chip forming area of the processing target 10. The second patterns for inspection 22B are formed on the dicing line. In the second patterns for inspection 22B, the marks 223 as recesses having length D2 and width W2 are formed to overlap the patterns for overlay shift inspection 22A in the width direction by the length L at the pitch p2 in the length direction.

Subsequently, overlay shift measurement is performed by using the first and second patterns for inspection 22A and 22B formed on the dicing lines (step S15). In the overlay shift measurement, first, light is irradiated on the first and second patterns for inspection 22A and 22B. Light diffracted by the first and second patterns for inspection 22A and 22B as diffractive gratings is detected. A sectional profile corresponding to marks of the repeated patterns is calculated from a result of the detection. Shift of the second patterns for inspection 22B with respect to the first patterns for inspection 22A is calculated. The shift includes the overlay amounts L in the width direction of the marks 221 and 223 and the overlay shift amount E caused by the exposure and the development of the resist 33. The overlay shift amount E is calculated by substituting, in Formula (1), the shift calculated from the first and second patterns for inspection 22A and 22B formed with the different overlay amount L.

Thereafter, it is determined whether the overlay shift amount E is within an allowable range in performing the subsequent processing (step S16). When the overlay shift amount is within the allowable range ("Yes" at step S16), the processing proceeds to the next step. Specifically, etching of the processing target 10 is performed by using the second mask pattern 35 formed at step S14 (step S17). The pattern forming method according to this embodiment ends.

On the other hand, when the overlay shift amount E is not within the allowable range ("No" at step S16), the second mask pattern 35 is removed by a method such as ashing (step S18). The processing returns to step S13. The processing is repeated until the overlay shift amount E is reduced to be within the allowable range.

The calculation of the overlay shift amount at step S15 and the processing for determining whether a value of the overlay shift amount is within the allowable range at step S16 can be realized by an information processing apparatus such as a personal computer.

The patterns for overlay shift inspection according to this embodiment can be used for the overlay shift inspection in the process for forming the via holes and the upper wire in an interlayer insulating film using the dual damascene method as explained above. However, the pattern forming method for forming a pattern using the patterns for inspection according to this embodiment can be applied to a process in general for digging a processing target deep to form a device pattern.

FIGS. 11A, 12A, 13A, and 14A are plan views of an example of a pattern forming method according to a related art. FIGS. 11B, 12B, 13B, and 14B are sectional views of the example of the pattern forming method according to the related art. In FIGS. 11B, 12B, 13B, and 14B, sections taken along B-B in the plan views of FIGS. 11A, 12A, 13A, and 14A are shown, respectively.

Figure 12A:
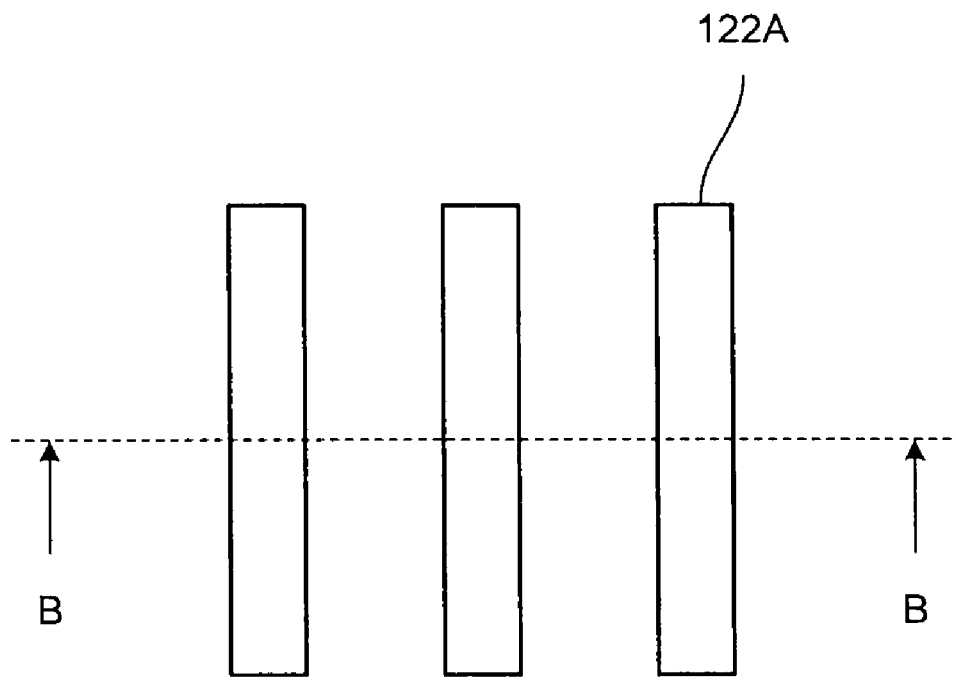
Figure 12B:
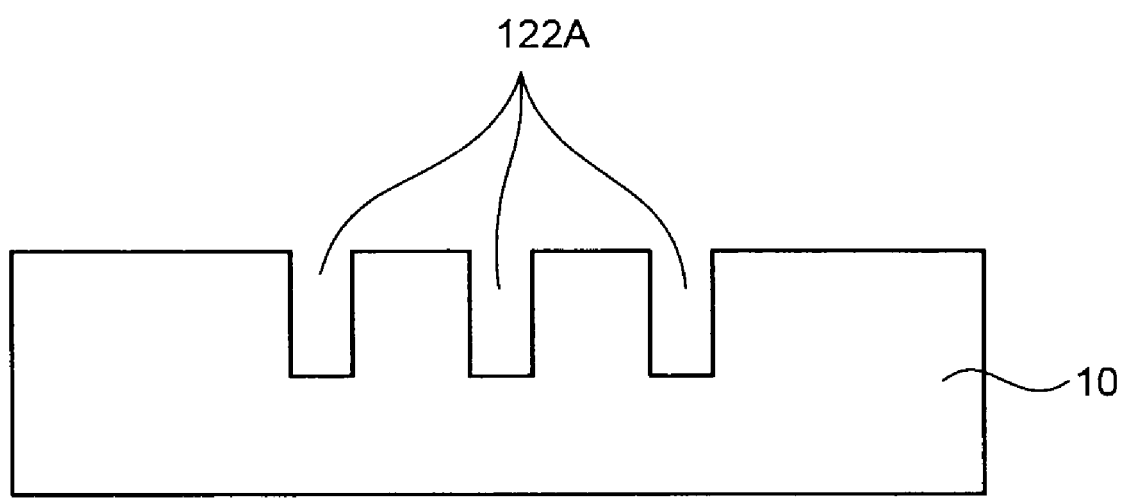
Figure 13A:
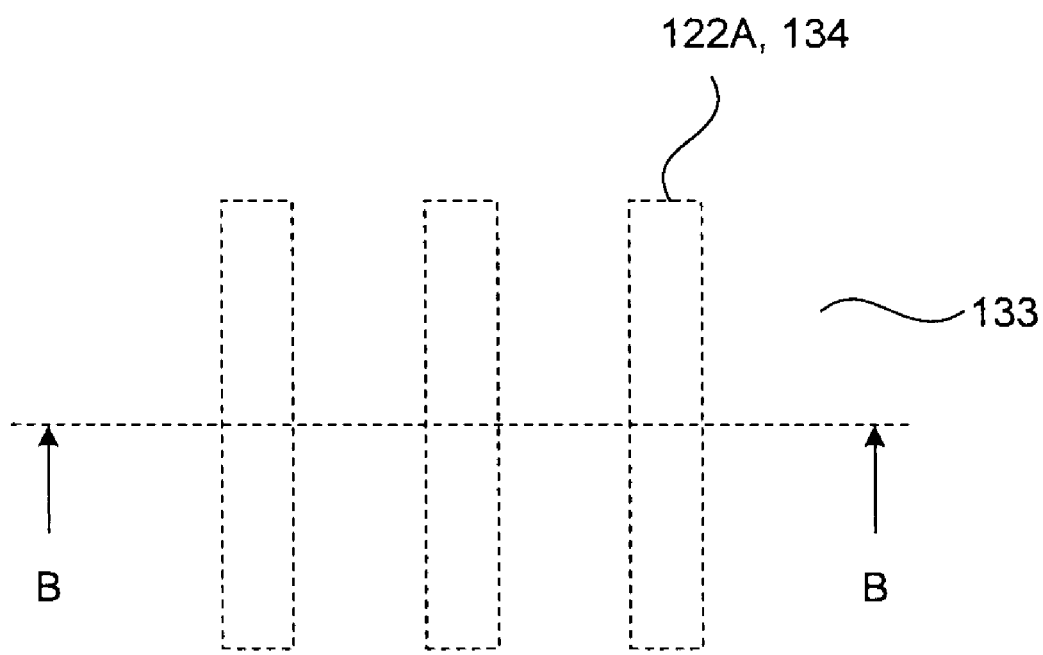
Figure 13B:
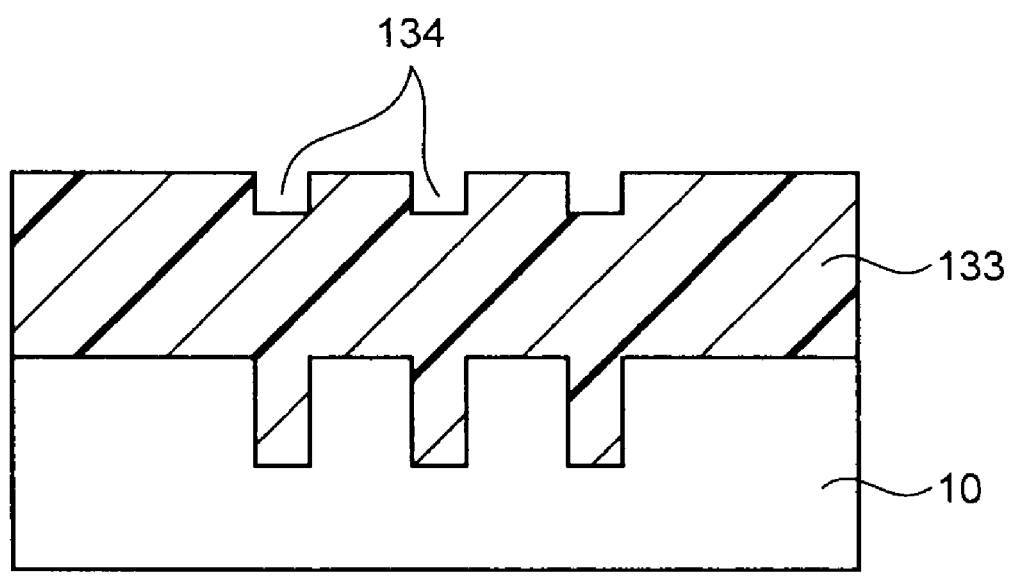
Figure 14A:
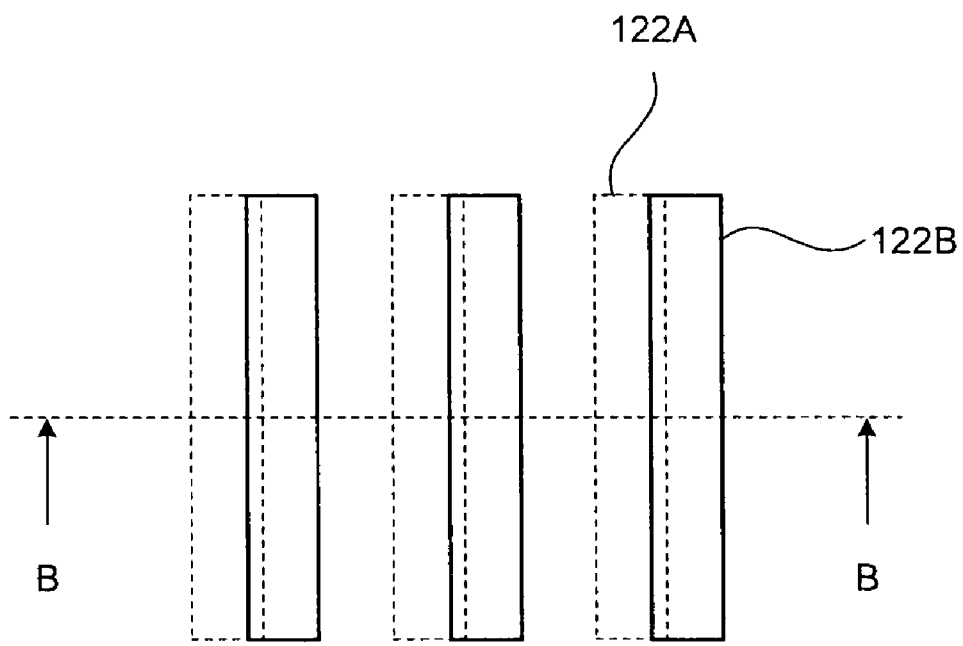
Figure 14B:
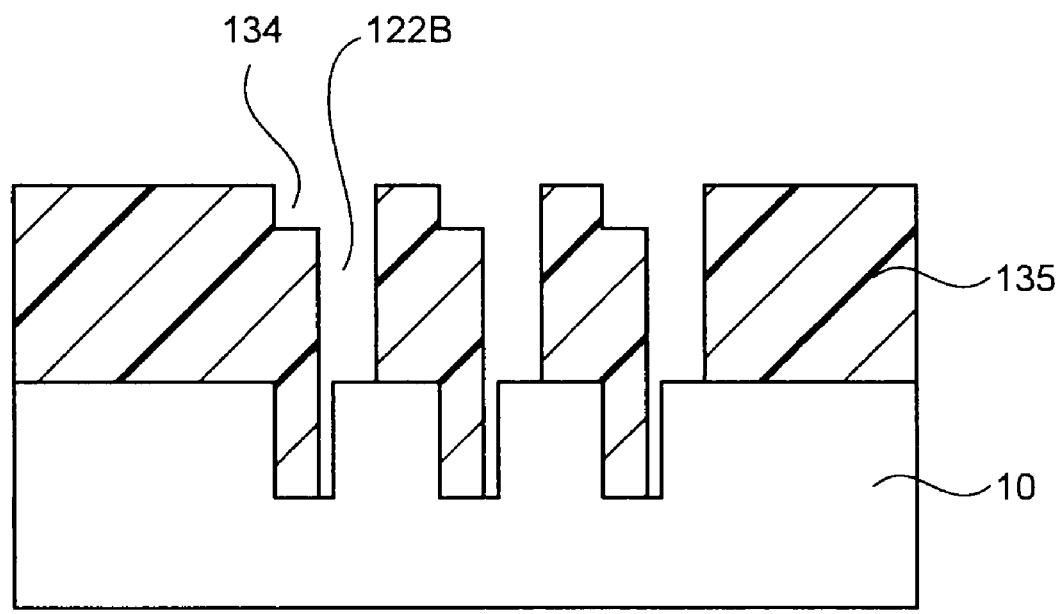

In the pattern forming method according to the related art, the processing target 10 is etched by using a mask pattern 131 formed such that rectangular openings 132 extending in the first direction are arrayed in the second direction (FIGS. 11A and 11B) and first patterns for inspection 122A are formed (FIGS. 12A and 12B). Subsequently, resist 133 is applied on the processing target 10 in which the first patterns for inspection 122A is formed (FIGS. 13A and 13B). A mask pattern 135 having second patterns for inspection 122B in which rectangular openings extending in the first direction are arrayed in the second direction is formed by the lithography (FIGS. 14A and 14B). The second patterns for inspection 122B are formed to be shifted in the second direction to partially overlap forming positions of the first patterns for inspection 122A. Light is irradiated on the first and second patterns for inspection 122A and 122B. The overlay shift amount E is calculated as explained above to determine whether the processing proceeds to the next step.

In the method according to the related art, as shown in FIG. 14A, the second patterns for inspection 122B are formed to partially overlap the forming positions of the first patterns for inspection 122A. As shown in FIG. 13B, in the upper surface of the resist 133, recesses 134 are formed substantially right above the first patterns for inspection 122A. Therefore, in forming the second patterns for inspection 122B, the lithography should be applied to an area having such unevenness (steps). However, when the lithography is applied to the area having such unevenness, it is likely that defocus and fluctuation in the dimension of the second patterns for inspection 122B occur. The formation (accuracy) of the second patterns for inspection is affected. As a result, the accuracy of the calculation of the overlay shift amount E is also deteriorated. As explained above, in the patterns for inspection 122A and 122B according to the related art, marks in an upper layer are formed to be positioned directly on marks in a lower layer. Therefore, the method depends on process conditions such as steps of the marks in the lower layer.

On the other hand, in this embodiment, the marks in the upper layer are not formed to overlap the forming positions of the marks in the lower layer. In the length direction of the marks, the marks in the upper layer are arranged in areas among the marks in lower layers. In the width direction of the marks, the marks in the upper layer are arranged to overlap the forming positions of the marks in the lower layer by the length L. Consequently, no step is formed in the forming positions of the marks in the upper layer after the application of the resist 35. Therefore, when the resist 35 is exposed to light, the likelihood of occurrence of defocus, fluctuation in the dimension of the second patterns for inspection 22B, and the like can be reduced compared with that in the related art. In other words, the formation of the second patterns for inspection 22B in the upper layer is not affected by process conditions such as steps formed by the marks in the lower layer. As a result, there is an effect that shift of the patterns in the upper layer from original forming positions thereof can be accurately measured.

As explained above, according to the embodiment of the present invention, there is an effect that, when photoresist is formed and the patterns in the upper layer are overlapped and exposed to light on the patterns of the recesses formed in the lower layer, the patterns in the upper layer can be formed without being affected by the patterns in the lower layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method for forming a pattern in a processing target using a mask pattern formed in a resist applied on the processing target, the pattern forming method comprising:

applying a resist on the processing target in which a first device pattern cut in a predetermined shape and a first pattern for overlay shift inspection formed by arraying a plurality of first mark rows, in which marks cut in a rectangular shape are arrayed at predetermined intervals in a first direction, in a second direction perpendicular to the first direction are formed;

forming, in the resist, a mask pattern for forming a second device pattern and a second pattern for overlay shift inspection formed by arraying, in the second direction, a plurality of second mark rows in which marks cut in a rectangular shape are arranged among the marks arrayed in the first direction of the first mark row and a forming position in the second direction is arranged to overlap the first mark row by predetermined overlapping length;

calculating an overlay shift amount of the second pattern for overlay shift inspection with respect to the first pattern for overlay shift inspection by detecting diffracted light obtained by irradiating light on the first and second patterns for overlay shift inspection;

determining whether the calculated overlay shift amount is within a predetermined range; and when the overlay shift amount is not within the predetermined range, peeling off the resist and applying a new resist in which another mask pattern and another second pattern are to be formed on the processing target for determining whether the overlay shift amount is within the predetermined range and, when the overlay shift amount is within the predetermined range, processing the processing target using the mask pattern formed in the resist.

2. The pattern forming method according to claim 1, wherein the mark has structure in which a plurality of rectangular patterns having width smaller than width of the mark in the second direction are arrayed at predetermined intervals in the second direction.

3. The pattern forming method according to claim 1, wherein the mark has structure in which a plurality of rectangular patterns extending in the second direction and having length smaller than length of the mark in the first direction are arrayed at predetermined intervals in the first direction.

4. The pattern forming method according to claim 1, wherein the mark has structure in which a plurality of rectangular patterns having length smaller than length of the mark in the first direction and having width smaller than width of the mark in the second direction are arrayed at predetermined intervals in the first and second directions.

5. The pattern forming method according to claim 1, wherein length of the mark in the first direction is equal to or smaller than width of the mark in the second direction.

6. The pattern forming method according to claim 1, wherein pitch of the mark in the first direction is twice to three times as larger as length of the mark in the first direction.

7. The pattern forming method according to claim 1, wherein a plurality of combinations of the first and second patterns for overlay shift inspection having different overlapping lengths are formed.

8. The pattern forming method according to claim 1, wherein a combination of the first and second patterns for overlay shift inspection provided such that the second direction coincides with an X direction on the processing target and a combination of the first and second patterns for overlay shift inspection provided such that the second direction coincides with a Y direction orthogonal to the X direction on the processing target are formed.

9. The pattern forming method according to claim 8, wherein a plurality of combinations of the first and second patterns for overlay shift inspection with the second direction set in the X direction to make the overlapping lengths in the respective patterns for overlay shift inspection different are formed, and a plurality of combinations of the first and second patterns for overlay shift inspection with the second direction set in the Y direction to make the overlapping lengths in the respective patterns for overlay shift inspection different are formed.

10. The pattern forming method according to claim 7, wherein, when the overlapping lengths in design of first and second combinations of the first and second patterns for overlay shift inspection are represented as L and −L, respectively, and actual overlapping lengths of the first and second combinations including an overlay shift amount E in the second direction of the second pattern for overlay shift inspection with respect to the first pattern for overlay shift inspection are represented as "a" and "d", respectively, the overlay shift amount is calculated by the following formula:

$$E = L\frac{a+d}{a-d}.$$

11. A pattern designing method for designing a pattern including a device pattern formed on a processing target and a pattern for overlay shift detection having a diffractive grating shape for detecting overlay shift with respect to a pattern already formed on the processing target, the pattern designing method comprising:

designing a first pattern including a first device pattern formed on the processing target and a first pattern for overlay shift inspection formed by arraying a plurality of first mark rows, in which rectangular marks are arrayed at predetermined intervals in a first direction, in a second direction perpendicular to the first direction; and designing a second pattern including a second device pattern formed on the processing target and a second pattern for overlay shift inspection formed by arraying, in the second direction, a plurality of second mark rows in which, on the processing target, rectangular marks are arranged among the rectangular marks arrayed in the first direction of the first mark row and a forming position in the second direction is arranged to overlap the first mark row by predetermined overlapping length.

12. The pattern designing method according to claim 11, wherein the mark has structure in which a plurality of rectangular patterns having width smaller than width of the mark in the second direction are arrayed at predetermined intervals in the second direction.

13. The pattern designing method according to claim 11, wherein the mark has structure in which a plurality of rectangular patterns extending in the second direction and having length smaller than length of the mark in the first direction are arrayed at predetermined intervals in the first direction.

14. The pattern designing method according to claim 11, wherein the mark has structure in which a plurality of rectangular patterns having length smaller than length of the mark in the first direction and having width smaller than width of the mark in the second direction are arrayed at predetermined intervals in the first and second directions.

15. The pattern designing method according to claim 11, wherein length of the mark in the first direction is equal to or smaller than width of the mark in the second direction.

16. The pattern designing method according to claim 11, wherein pitch of the mark in the first direction is twice to three times as larger as length of the mark in the first direction.

17. A mask set including, according to a processing process for a processing target, a plurality of masks for exposure each including a device pattern formed on the processing target and a pattern for overlay shift detection having a diffractive grating shape for detecting overlay shift with respect to a pattern formed on the processing target by a different processing process, the mask set comprising:

a first mask for forming, on the processing target, a pattern including a first device pattern and a first pattern for overlay shift inspection formed by arraying, in a second direction, a plurality of first mark rows in which rectangular marks are arrayed at predetermined intervals in a first direction perpendicular to the second direction; and a second mask for forming, on the processing target, a pattern including a second device pattern and a second pattern for overlay shift inspection formed by arraying, in the second direction, a plurality of second mark rows in which, on the processing target, rectangular marks are arranged among the rectangular marks arrayed in the first direction of the first mark row and a forming position in the second direction is arranged to overlap the first mark row by predetermined overlapping length.

18. The mask set according to claim 17, wherein the mark has structure in which a plurality of rectangular patterns having width smaller than width of the mark in the second direction are arrayed at predetermined intervals in the second direction.

19. The mask set according to claim 17, wherein the mark has structure in which a plurality of rectangular patterns extending in the second direction and having length smaller than length of the mark in the first direction are arrayed at predetermined intervals in the first direction.

20. The mask set according to claim 17, wherein the mark has structure in which a plurality of rectangular patterns having length smaller than length of the mark in the first direction and having width smaller than width of the mark in the second direction are arrayed at predetermined intervals in the first and second directions.

* * * * *